(12) United States Patent
Erdemir et al.

(10) Patent No.: US 7,846,556 B2
(45) Date of Patent: Dec. 7, 2010

(54) MODULATED COMPOSITE SURFACES

(75) Inventors: Ali Erdemir, Naperville, IL (US);
Kursat Kazmanli, Bostanci-Istanbul (TR); Osman Levent Eryilmaz, Bolingbrook, IL (US); Mustafa Urgen, Besiktas-Instanbul (TR); Oyelayo O. Ajayi, Oswego, IL (US); George R. Fenske, Downers Grove, IL (US); Izhak Etsion, Haifa (IL)

(73) Assignee: UChicago Argonne, LLC, Chicago, IL (US)

( * ) Notice: Subject to any disclaimer, the term of this patent is extended or adjusted under 35 U.S.C. 154(b) by 676 days.

(21) Appl. No.: 11/823,382

(22) Filed: Jun. 27, 2007

(65) Prior Publication Data
US 2008/0057272 A1  Mar. 6, 2008

Related U.S. Application Data

(60) Provisional application No. 60/842,490, filed on Sep. 6, 2006.

(51) Int. Cl.
*B23P 9/00* (2006.01)

(52) U.S. Cl. .................. 428/687; 428/67; 428/908.8; 427/271; 427/331

(58) Field of Classification Search ............. 428/687, 428/67, 141, 157, 908.8
See application file for complete search history.

(56) References Cited

U.S. PATENT DOCUMENTS 6,655,845 B1 * 12/2003 Pope et al. ................ 384/492

* cited by examiner

*Primary Examiner*—Aaron Austin
(74) *Attorney, Agent, or Firm*—Foley & Lardner LLP

(57) ABSTRACT

Methods and compositions relating to the preparation of structurally and compositionally modulated composite surfaces that can potentially reduce friction and increase resistance to wear and scuffing in rolling, rotating and sliding bearing applications. Preparation of nano-to-micro size pores, holes, or dimples on a given solid surface and filling them with soft or hard coatings at desired thickness to achieve such properties.

20 Claims, 7 Drawing Sheets

MODULATED COMPOSITE SURFACES

CROSS-REFERENCE TO RELATED PATENT APPLICATIONS

This application claims the benefit under 35 USC 119(e) of U.S. Application 60/842,490, filed Sep. 6, 2006, incorporated herein by reference in its entirety.

STATEMENT OF GOVERNMENT INTEREST

"The United States Government has rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory."

BACKGROUND OF THE INVENTION

The present invention relates generally to the field of low friction compositions. More specifically, the present invention relates to methods and compositions relating to modulated composite surfaces having concave portions of an article.

Laser texturing has enormous potential for increasing efficiency and durability of a wide range of tribological components. For example, the applications among engine components are wide ranging. In engines, laser texturing can have a positive impact on the performance and efficiency of a wide variety of components including, but not limited to, piston rings and liners, tappets, wrist pins, cam and follower interface, gear systems, water pump seals, and other bearing systems. Many of these components operate under different lubrication regimes during actual engine uses.

There are three main operating lubricating regimes as illustrated in FIG. 1. In the hydrodynamic regime, component surfaces are completely separated by the lubricant fluid film and no wear or surface damage is expected. The other extreme is the boundary regime in which severe contact occurs between the component surfaces. In this regime, friction is higher; and wear and scuffing readily occur. Component surfaces must be protected in this regime to ensure adequate durability. Laser surface texturing ("LST") has been shown to reduce friction in different lubrication regime, but wear in the boundary regime may reduce the effectiveness of LST over time. Both wear and scuffing occur primarily in the boundary lubrication regime.

Thus, there is a need for a method, article of manufacture and composition that will protect a laser textured surface (or otherwise surface modified material) and preserve its effectiveness over time.

SUMMARY OF THE INVENTION

Compositions and methods of the present invention comprising coatings on textured surfaces can further reduce friction and wear and prevent scuffing under severe loading conditions, where direct metal-to-metal (or other materials, such as ceramics or polymers or composites) contact occurs. The present invention relates to a novel method for the preparation of structurally and compositionally modulated composite surfaces that can potentially reduce friction and increase resistance to wear and scuffing in rolling, rotating and sliding bearing applications. The present invention involves, in one embodiment, preparation of concave texture, including without limitation, nano-to-micro size pores, holes, or dimples on a given solid surface and filling them with soft or hard coatings (such as a high thermal conductivity material, a lubricating material, and a superhard nanocomposite) at desired thickness to achieve such properties. Lubricants can include lubricating oil, grease, lamellar solid lubricants and boric acid containing material. Composition of modulated surfaces can be controlled to achieve any type of desired property for a given application. This would include different materials disposed with a given one of the concave textures and different material in another one of the concave textures. This would allow achieving multiple objectives, such as reduced friction and improved thermal properties.

These and other objects, advantages, and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF THE PREFERRED EMBODIMENTS

Figure 1:
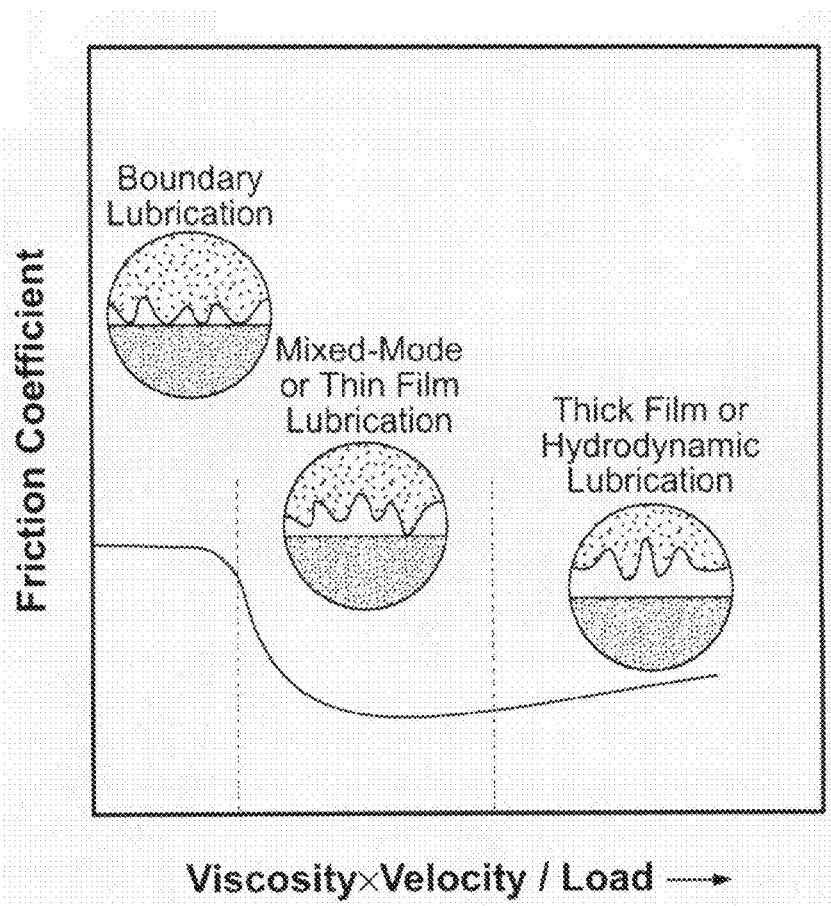
FIG. 1 is a Stribeck diagram which provides a schematic illustration of lubrication regimes and friction behavior.

This invention relates to a method for the preparation of, articles of manufacture and/or compositions comprising structurally and compositionally modulated composite surfaces that can reduce friction and increase resistance to wear and scuffing in rolling, rotating and sliding bearing applications. One embodiment of the present invention comprises preparation of pores, holes, or dimples, such as but not limited to, nano-to-micro size, on a given solid surface and filling them with soft or hard coatings at desired thickness to achieve the desired properties. For example, one aspect of the invention relates to holes or dimples filled with soft metals to increase the surface thermal, mechanical, tribological and electrical properties. Application of a superhard nanocomposite film can preserve the geometric integrity (size, depth, shape, etc.) of the special textures so that they can provide low friction and wear over extended periods of time. Such manipulation of near surface structure, composition, and hence the properties of solid surfaces provides significant beneficial effects for a wide range of industrial applications. For example, but not limited to, the invention can be applied in the tribology area to benefit from these methods, articles and compositions. Such specially prepared surfaces can be used to control thermal and/or electrical conductivity of contacting surfaces, or they can be used to lower friction and increase resistance to wear and scuffing. The composition of modulated surfaces can be controlled to achieve virtually any selective type of desired property for a given application.

The present invention also relates to superhard coatings that can prevent seizure, galling and scuffing under severe conditions of various demanding tribological applications, including but not limited to gears, bearings, tappets, valves and valve guides, power train components, piston pins, rings and liners. In addition, the subject coating can be used in other mechanical components in all classes of moving mechanical systems that experience heavy loading, high speeds, erosive and corrosive environments and elevated temperatures under rolling, rotating, sliding and impacting conditions. More specifically, these coatings and articles prevent scuffing between heavily loaded surfaces under lubricated sliding conditions which are typical of these mechanical components and others (like chain links used in conveyor belts and other heavy machinery such as earth-moving equipments). One of the most important features of these coatings is their ability to function, or prevent scuffing, even in the total absence of anti-friction and anti-wear additives in oils. This increases the prospect that these methods and compositions can eliminate the uses of sulfur and phosphorous bearing additives from lubricating oils, which additives are very effective in reducing friction and increasing resistance to wear and scuffing but which have severe adverse effects on engine's emission control devices. "Scuffing" is a common term used in the field of Tribology, and is defined as a severe adhesive failure of sliding surfaces that are subject to sliding under high speed, high load, minimal lubrication conditions. Under such conditions, more intimate contact occurs; and this leads to higher friction and heating which ultimately causes the two surfaces suffer sudden, massive adhesive failure or seizure. The events are dramatic enough to cause permanent structural changes in and around the scuffed regions of the surfaces.

In another embodiment of the present invention, addition of a hard wear-resistant coating, such as a superhard nanocomposite coating, protects the LST and preserves its effectiveness over longer time and broader load ranges. These nanocomposite coatings can include, for example, carbides, nitrides, cermets and refractory oxides.

Scuffing of a surface is initiated by a severe local plastic deformation and large localized heat generation. Progression of local scuffing damage to final catastrophic failure is determined by how quickly the heat can be dissipated. If the rate of local heat dissipation is greater than the rate of generation, scuffing can be prevented. In one embodiment of the present invention, the dimples of LST are filled with higher thermal conductivity material, such as but not limited to, copper.

Thus, the filing of the dimples with a highly thermal conductive promotes rapid dissipation of local heat and prevention of scuffing. In light of this invention description, one of ordinary skill in the art will appreciate that any material with a rate of heat dissipation greater than the rate of heat generation by plastic deformation in the substrate material is expected to prevent scuffing in the substrate material.

Figure 2:
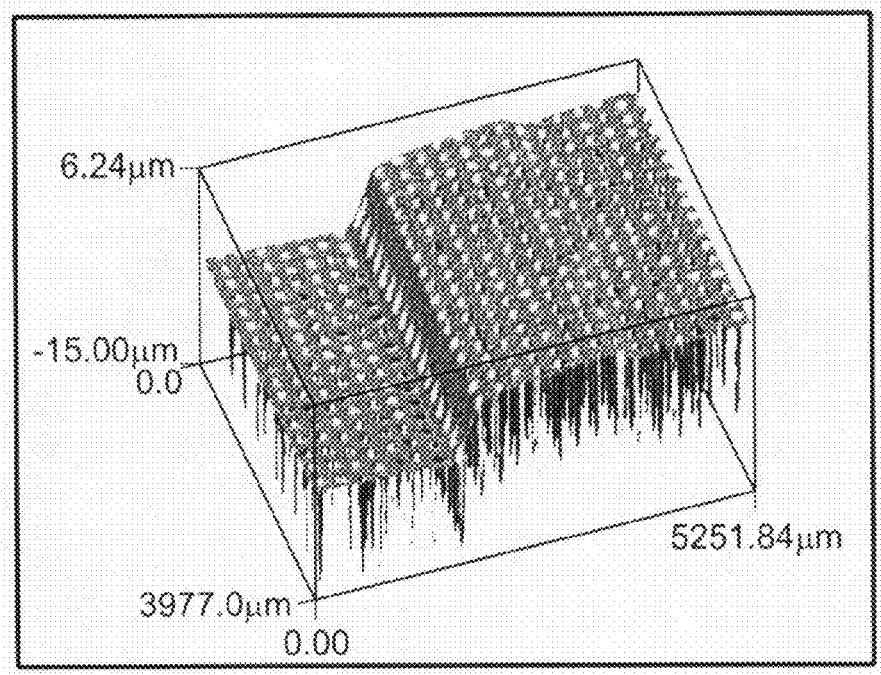
FIG. 2 is a three dimensional surface profile showing uncoated and Cu-coated segments of a dimpled surface.
Figure 3A:
FIG. 3A illustrates a plane view and FIG. 3B a cross-sectional view of dimples filled with copper.
Figure 4A:
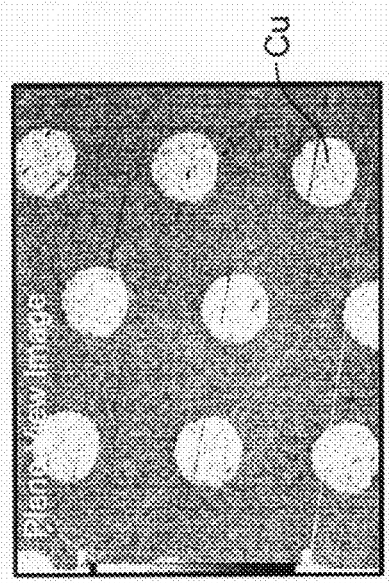
FIG. 4A shows a superhard coating applied over a dimple.
Figure 3B:
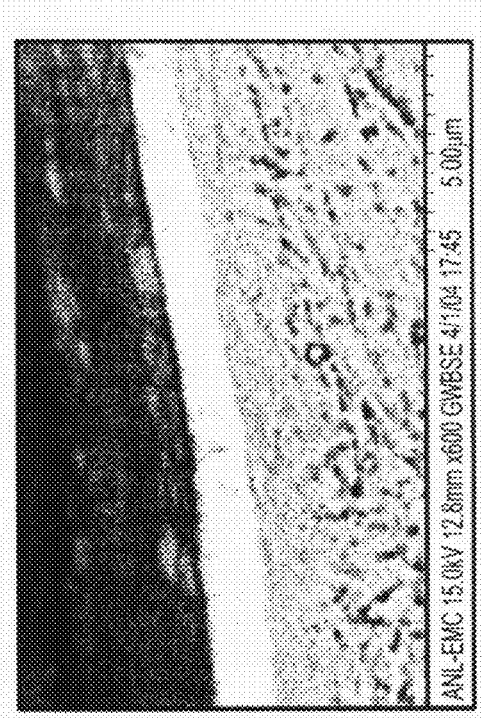
Figure 4B:
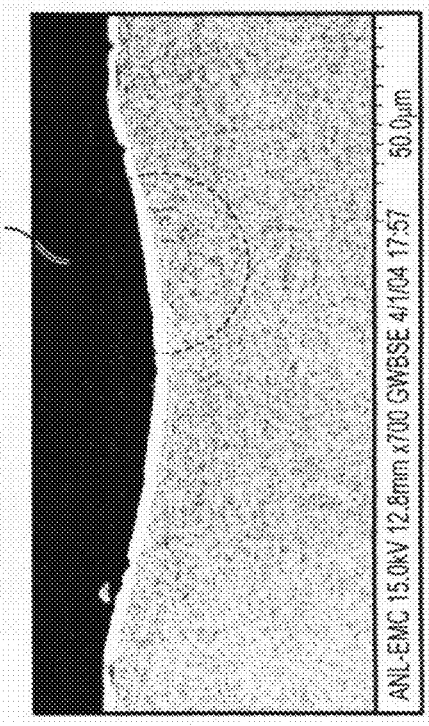
FIG. 4B is a magnified detail of a segment showing details of coating and H13 steel substrate (on the right)

FIG. 2 shows a 3D surface profile of a material having coated and uncoated sections of dimpled surface. A section of the laser textured/dimpled surface is covered with a sufficiently thick (i.e., thicker than the depth of dimples) Cu coating. Then, excess Cu is polished out, and the remaining structure (shown in FIGS. 3 and 4) will consist of the base surface and Cu filled dimples that can act as heat sinks, slick spots, or lubricant pockets under sliding conditions. Likewise, thinner Cu coatings can be produced over the dimpled surfaces; and when excess Cu is polished out, then a partially filled and dimpled surface can be obtained. Such a surface will have additional benefits under certain application conditions. In a similar fashion, superhard and other low friction coatings (such as nearly frictionless carbon, carbide derived carbon, and diamond) can also be produced on top of the dimpled surfaces to enhance their friction and wear properties.

In a preferred texturing method, the dimples created by pulsating laser beams on a surface are typically 4-10 µm deep and 70 to 100 µm wide. These dimples not only reduce friction by increasing the hydrodynamic efficiency of sliding surfaces, but can also reduce wear by effectively trapping wear debris or third-body particles generated at sliding interfaces. Overall, when such optimized dimples are produced on various sliding surfaces including engine and drivetrain components, one can certainly expect much improved fuel economy due to reduced friction or torque, while reduced wear translates into longer durability and hence reliability.

EXAMPLES

The following non-limiting examples of embodiments of the present invention can reduce friction and increase wear and scuffing resistance of laser textured surfaces. These surfaces were laser textured and also further were modified by coating with a superhard nano composite coating made out of Mo—N—Cu and by filling the dimples with pure Cu. As an example, the effects of such combined surface treatment on scuffing resistance of five different samples were compared.

A reciprocating wear test machine capable of providing reliable friction, wear, and scuffing values was used to test the samples. H13 steel was used as the substrate material for all the samples described herein, and the surface texturing of H13 was performed by means of laser dimpling method. However, one of ordinary skill in the art will appreciate that the scope of the present invention is not limited to H13 steel and laser dimpling. Any type of other solid materials including ceramics, composites, and polymeric materials can also be dimpled and other surface texturing methods may also be used to create special patterns or shallow dimples on the surfaces of these materials.

One of the main reasons for choosing Cu as the filler material is that with its very high thermal conductivity, it was expected to promote the dissipation of the frictional heat that is generated under the extreme contact conditions, like scuffing. Other high-thermal conductivity metals like silver, may also be used to act as a heat sink material on textured surfaces.

For further modification of the laser textured surfaces, a super hard Mo—N—Cu nano composite coating was applied over the dimpled surface using a magnetron sputtering process. To fill the dimples with copper, the dimpled sample first was coated with pure Cu again using the magnetron sputtering system and then it was polished off the excess copper from the surface; hence copper only remained within the dimples.

Likewise, the same concept may be used to achieve self-lubricating compositionally modulated surfaces. Specifically, the dimples may be filled with a solid lubricant (such as, but not limited to, boric acid, graphite, or molybdenum disulfide); and the resultant composite surface can provide low friction over extended periods of sliding contacts. A combination of improved lubrication and increased thermal conductivity may also be achieved with certain filler materials, such as silver as well as other noble metals and alloys thereof, which is a good solid lubricant at the same time excellent thermal conductor. Such composite surfaces may be used in electrical contact and switching devices where both low friction and high thermal and electrical conductivity are desired.

Figure 5:
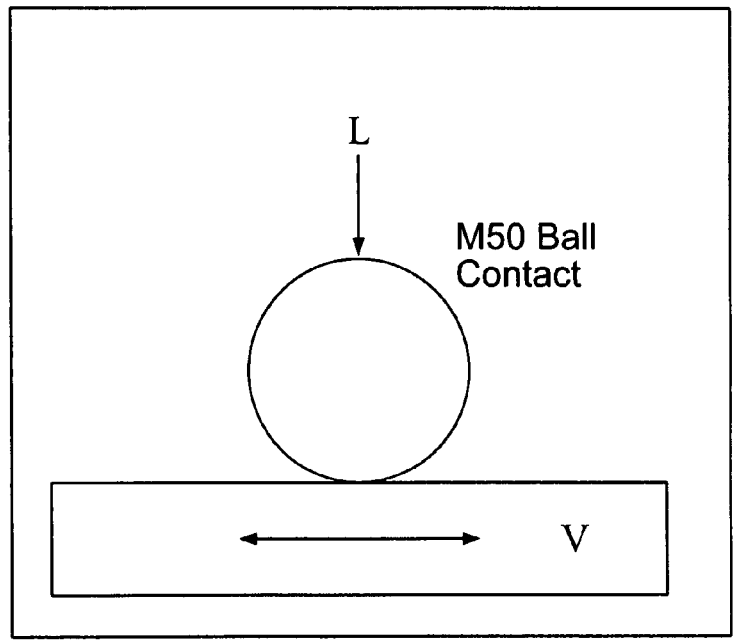
FIG. 5 illustrates contact geometry of a reciprocating test.

Sliding friction, wear and scuffing behavior of the samples prepared according to above procedures were evaluated in a reciprocating test machine whose schematic is shown in FIG. 5.

The sliding speed was changed on a stepwise manner while maintaining a constant loading condition with a ½" M50 ball which was reciprocating over a 20 mm distance on the surface of the samples in a fully formulated commercial synthetic motor oil. Sliding speed was varied from 1 Hz to 5 Hz in 1 Hz steps. The time interval of each step was 2 minutes. After reaching 5 Hz sliding speed, in case that scuffing did not occur, the normal load was increased by 50 lb; and the same procedure was followed at a different location with a different ball until the sliding pairs scuffed. Scuffing always coincided with an abrupt increase in the friction coefficient.

For quantification of the critical scuffing load, speed and friction coefficient in a single numerical term, a contact severity index (CSI) was calculated for each sample using the formula given below;

$$CSI = F \times S \times \mu$$

where F is critical scuffing load in Newtons, S is critical scuffing sliding speed in m/sec and $\mu$ is friction coefficient shortly before scuffing. According to the formula, increasing the contact severity index indicates higher scuffing resistance. CSI is a measure of frictional energy to cause scuffing.

Figure 6:
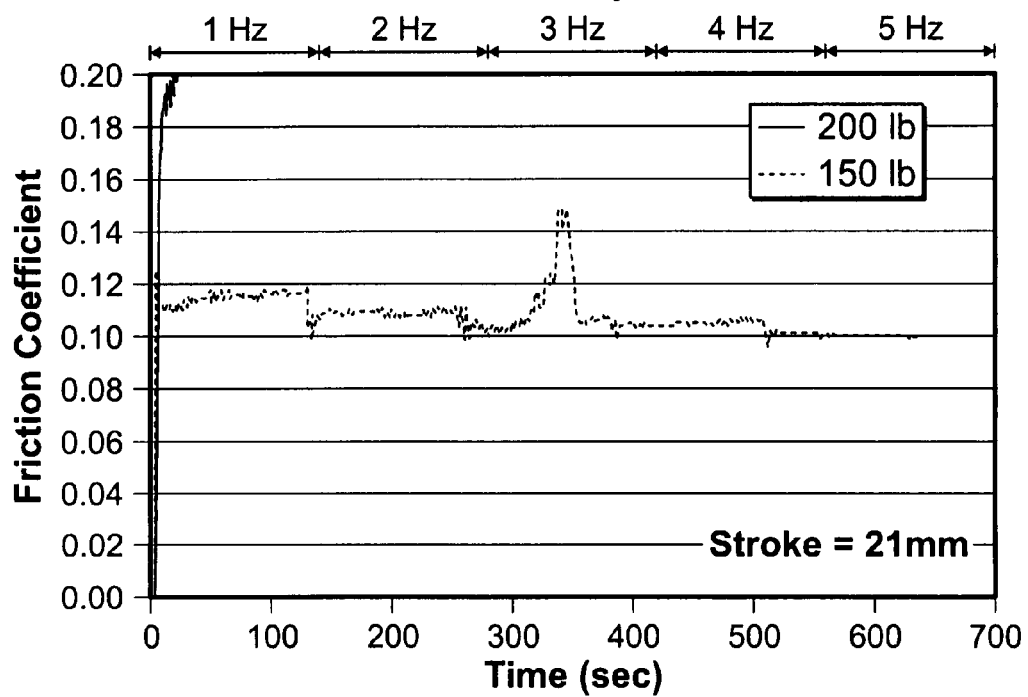
FIG. 6 shows the scuffing performance of the H13 base steel during sliding against a ½" M50 steel ball wherein the sample was scuffed at 200 lb normal load and 1 Hz sliding velocity.

The reciprocating test results of the H13 base (un-dimpled) samples are shown in FIG. 6. For 150 lb loading condition and throughout the increasing speed steps, H13 steel could not be scuffed. However, upon increasing the normal load to 200 lb, this caused H13 steel to scuff at the early stage of 1 Hz sliding speed.

Figure 7:
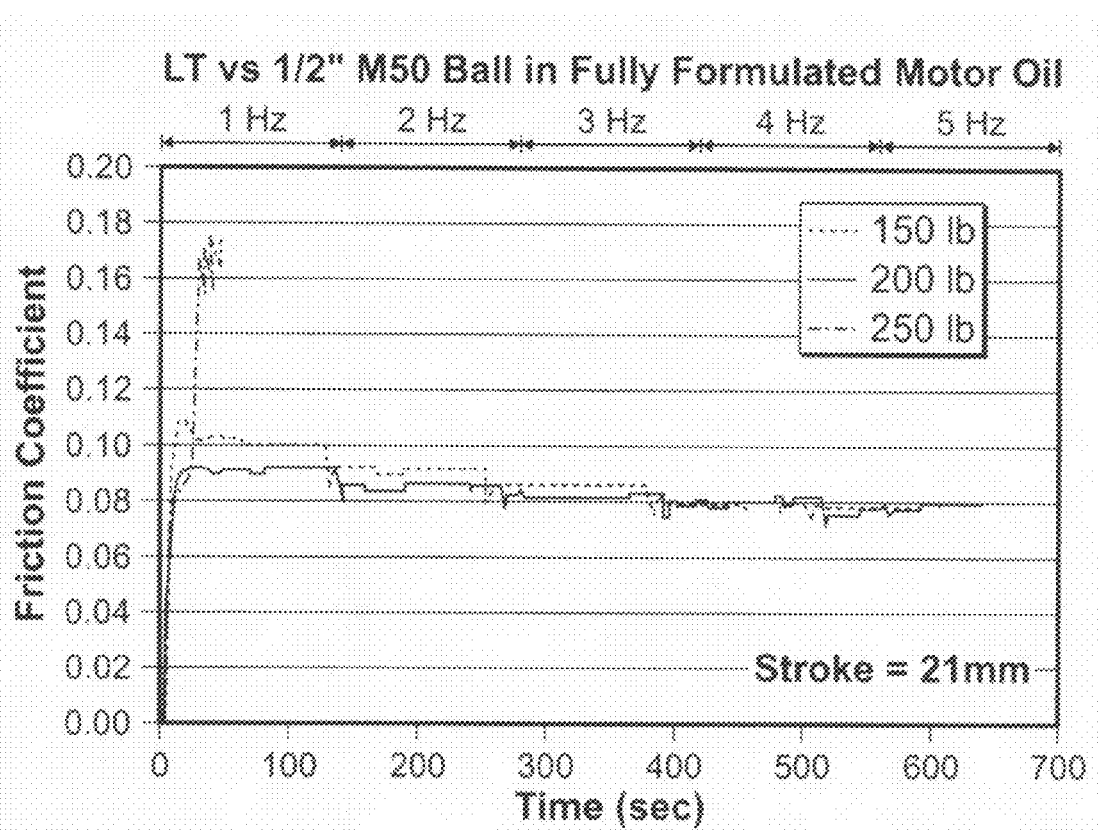
FIG. 7 illustrates the scuffing performance of laser textured H13 sample against a ½" M50 steel ball wherein the sample was scuffed at 250 lb normal load and 1 Hz sliding speed.

Friction coefficient of the laser textured H13 sample was lower than that of base H13 and changed with reciprocating speed starting from 0.1 to 0.08. As shown in FIG. 7, the scuffing limit of H13 steel was also significantly improved after laser texturing. It took up to 250 lb normal load and 1 Hz reciprocating speed for laser textured H13 to be scuffed.

Figure 8:
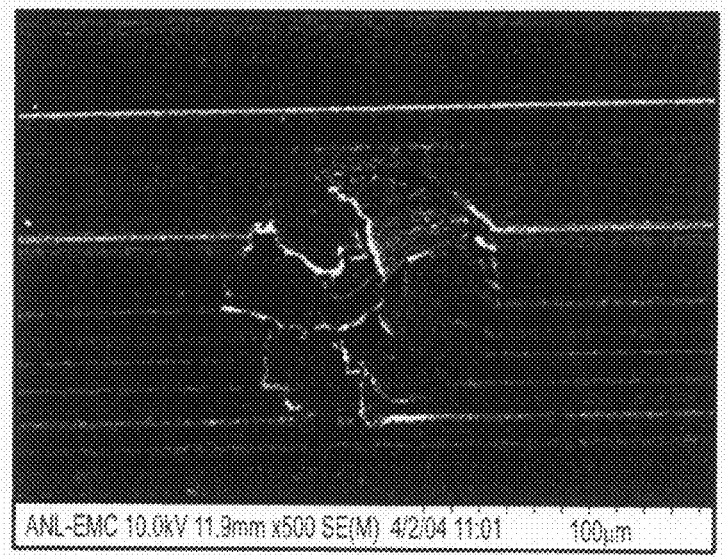
FIG. 8 is an SEM photomicrograph of a dimple that was squashed and filled with worn material during a sliding test.

Post-test examination of such surface indicated that the dimples on the laser-textured surfaces were destroyed and clogged with plastically flown steel and debris particles (see FIG. 8 showing a SEM photomicrograph of a dimple that was squashed and filled with worn material during sliding test.). Hence, they were no longer able to store lubricant and hence increase the hydrodynamic efficiency of these dimpled surfaces. Without limiting the scope of the invention, it is currently believed that severe metal-to-metal contact had occurred on these laser-textured surfaces at high loads; and this greatly diminished their ability to resist scuffing.

Figure 9:
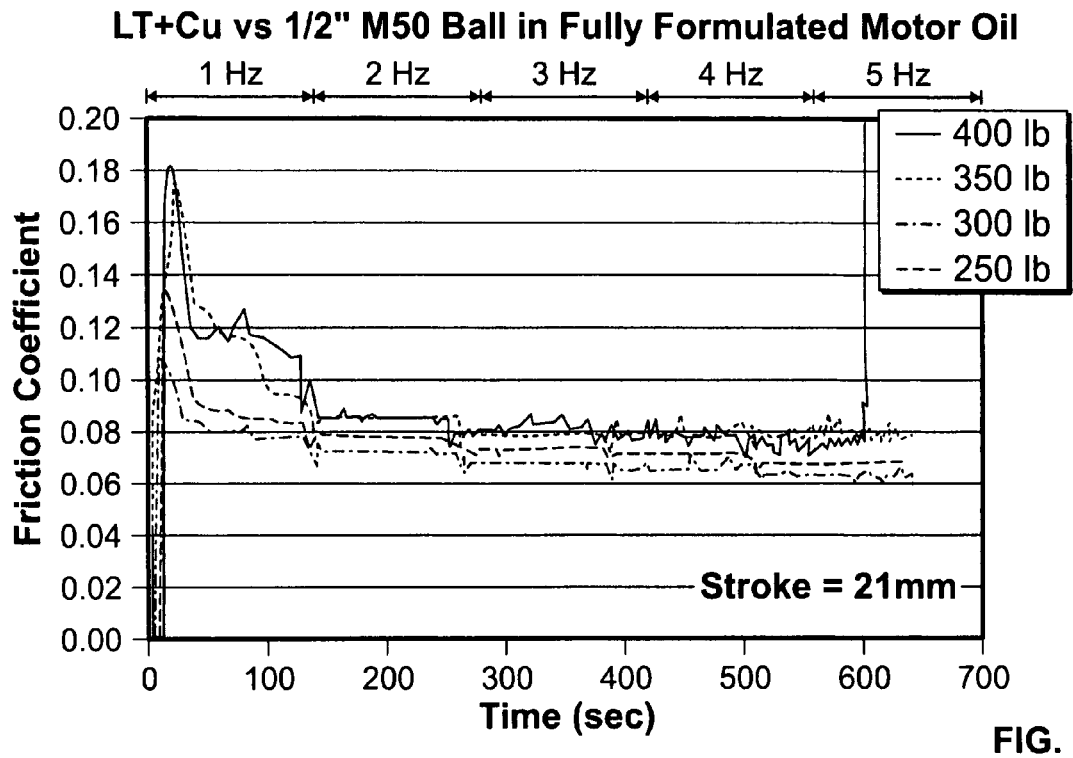
FIG. 9 shows the scuffing performance of the laser textured and Cu-filled H13 sample against a ½" M50 steel ball wherein the sample was scuffed at 400 lb normal load and 5 Hz speed.

As can be seen from the results in FIG. 9, filling the dimples with copper had a significant positive impact on scuff resistance of dimpled H13 surfaces. Specifically, it nearly doubled the scuffing load. The results of the scuffing experiments conducted on the Cu filled-dimpled surfaces are summarized in FIG. 10. Existence of Cu in the dimples considerably raised the critical scuffing load and speed of the textured H13 up to 400 lb and 5 Hz, respectively. The friction coefficient before the scuffing was lowered to 0.08 (see FIG. 9), suggested that copper has a beneficial effect on friction as well. Therefore, in addition to the high scuffing resistance, a lower friction coefficient for the article of manufacture was another significant point of the experimental observations. Depending on the loading and sliding conditions, the friction coefficient of LT/Cu sample varied between 0.08 and 0.065 as shown in FIG. 9. A possible tribo-chemical reaction between copper and formulated oil may have formed a tribo-film giving a low friction coefficient, even at very high loading conditions, in combination with the heat removal properties of the Cu.

Figure 10:
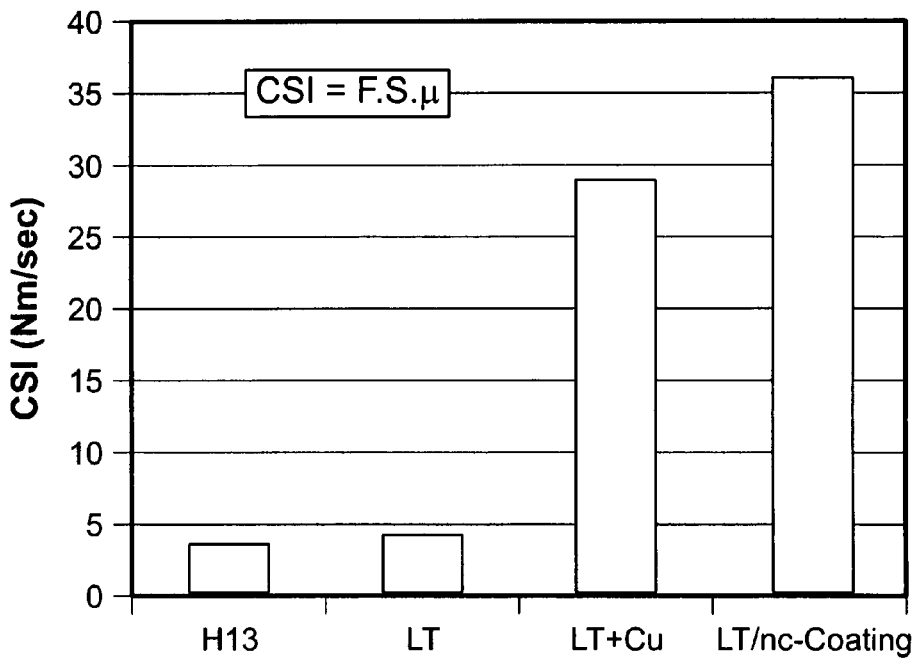
FIG. 10 illustrates the scuffing performance of an H13 base steel, laser-textured H13 steel (LT), laser textured and superhard coated H13 steel (LT/nc-coating), and laser-textured and copper coated (LT+Cu) surfaces.

Application of superhard MoN—Cu on laser textured surfaces provided further protection against wear and scuffing. The dimple shape, size, and geometry were intact after the scuffing tests; and the situation shown in FIG. 8 was no longer the case. The superhard coating was able to protect these dimples against wear and deformation; are thus they could maintain their functions up to a more severe loading conditions. FIG. 10 provides the contact severity indexes (CSI) of all the samples tested described in the examples herein. According to this figure, the modifications of the laser textured surfaces by copper and/or nanocomposite coating substantially improved the scuffing resistance of all the samples tested. Without limiting the invention, it is believed that improved heat dissipation provided by copper and the preservation of dimples by superhard coating were the main reasons for enhanced resistance to scuffing.

Soft copper and/or superhard coatings can have a significant beneficial effect on friction, wear and scuffing performance of laser textured surfaces. In particular, they can dramatically increase the resistance of laser-textured surfaces to scuffing. Such compositionally modulated surfaces can be used to overcome friction, wear and scuffing related problems in all kinds of rolling, rotating, and sliding components in engines and other mechanical systems.

Figure 11:
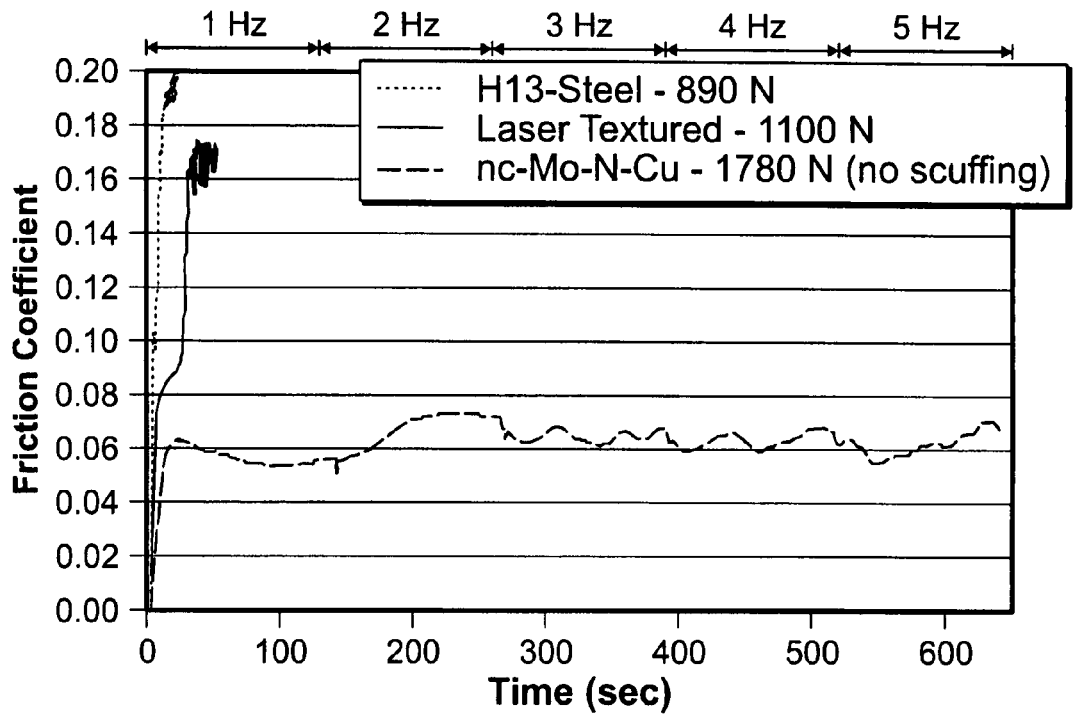
FIG. 11 shows the results of scuffing tests with different materials (note the nanocomposite Mo—N—Cu coating could not be scuffed even after reaching the limits of the test machine)
Figure 12:
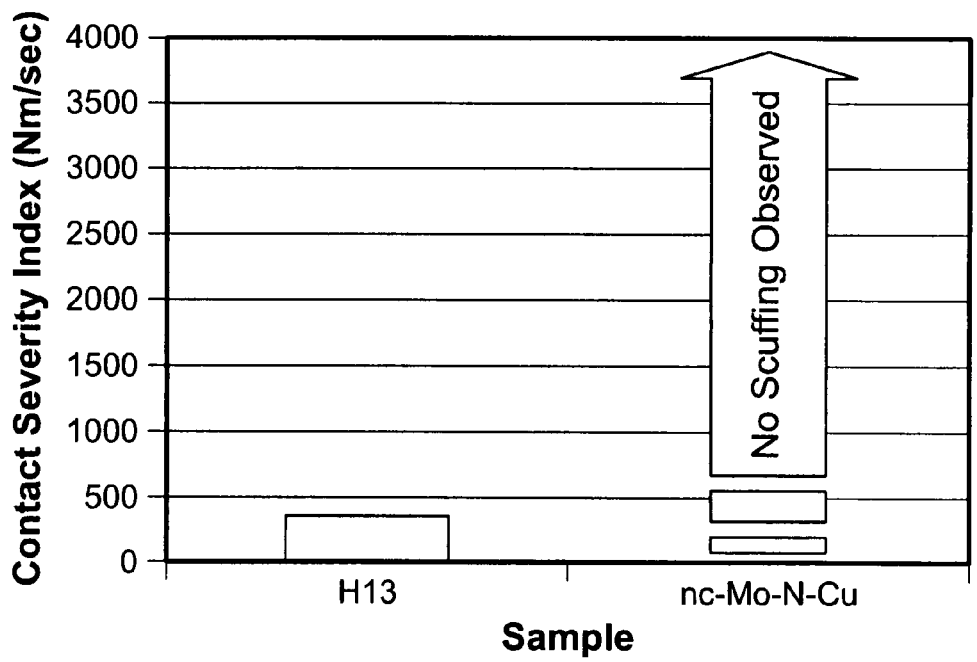
FIG. 12 shows the comparison of the contact severity index for uncoated and nanocomposite Mo—N—Cu-coated H13 steel.
Figure 13:
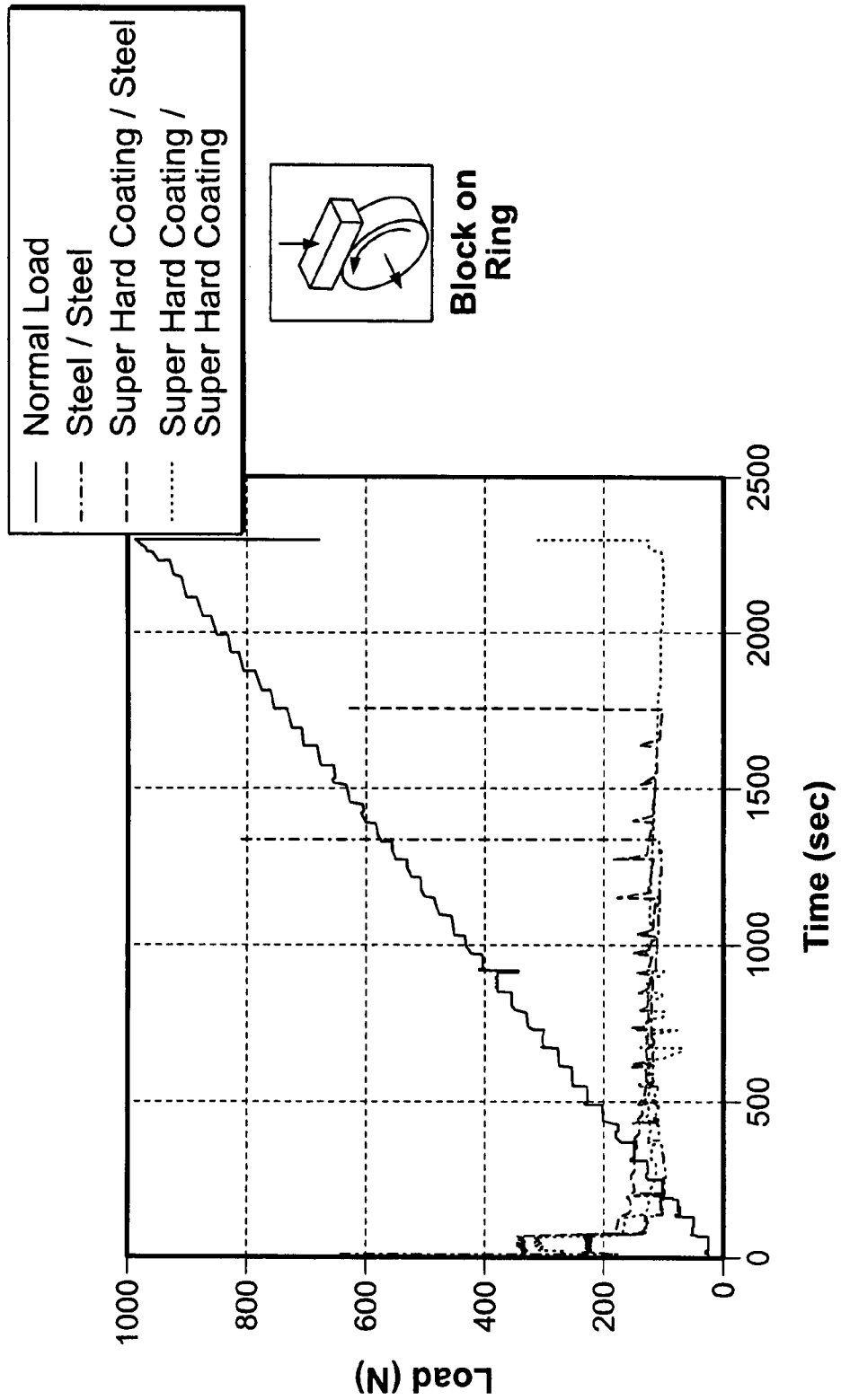
FIG. 13 shows the comparison of the scuff resistance of a superhard coating in base oil.

FIG. 11 shows how such a coated surface resist scuffing, while FIGS. 12 and 13 provide information on actual scuffing limits or points of an uncoated and coated surfaces as represented by a contact severity index or CSI in formulated and base oils. These results confirm a very unique property of superhard coatings: regardless of the presence or absence of anti-agents scuffing agents or additives in oils, they will still prevent scuffing.

These preferred coatings consist of a metallic phase and a hard nitride, boride, cermet, or carbide phase. Because of a composite microstructure, they are superhard and hence very resistant to wear. Metallic phases in these coatings have the ability to lower friction under boundary lubricated sliding conditions; mainly because of the formation of a slippery boundary film on rubbing surfaces. These coatings can be produced in all kinds of physical and chemical vapor deposition systems using the necessary precursor materials and/or chemical compounds. These coatings can be used in various manufacturing and transportation applications such as machining and metal forming tools, fuel injectors, gears, bearings and some of the power- and drive-train applications in cars and tracks.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. Any amounts listed are to be interpreted to include the term about unless otherwise indicated as exact. The embodiments were chosen and described in order to explain the principles of the present invention and its practical application to enable one skilled in the art to utilize the present invention in various embodiments, and with various modifications, as are suited to the particular use contemplated.

What is claimed is:

1. An article of manufacture, comprising:
a substrate material having a surface;
a concave texture applied to the surface of the substrate material, the concave texture including a plurality of depressions in the surface; and
a thin layer of a lubricating material bonded to the textured surface, the lubricating material disposed substantially within the plurality of depressions of the concave texture and characterized by a hardness that is less than that of the substrate material and further characterized by a thermal conductivity greater than the substrate material, thereby improving a tribological property of the surface relative to the textured surface
wherein the textured surface is substantially free of the lubricating material outside the depressions.

2. The article as defined in claim 1 wherein the substrate material is selected from a group consisting of a metal, a ceramic, a polymer and composite materials.

3. The article as defined in claim 1 wherein the plurality of depressions comprise features created by laser surface texturing, and wherein each of the plurality of depressions is between about 70 to about 100 μm wide.

4. The article as defined in claim 1 wherein the plurality of depressions are filled with the lubricating material to substantially the elevation of the surface of the substrate material surrounding the respective depression.

5. The article as defined in claim 4 wherein the lubricating material comprises at least one of a lubricating oil, a lubricating grease, lamellar solid lubricants, and a boric acid containing material.

6. The article as defined in claim 4 wherein the lubricating material comprises a metal.

7. The article as defined in claim 6 wherein the metal comprises a noble metal.

8. The article as defined in claim 6 wherein the metal comprises copper.

9. The article as defined in claim 1 further including a nanocomposite layer disposed over the thin layer, and wherein the nanocomposite layer results in further improvement of the tribological property of the substrate material.

10. The article as defined in claim 9 wherein said nanocomposite layer is selected from the group consisting of Mo—N—Cu, a carbide, a boride, a nitride, a cermet, a refractory oxide and combinations thereof.

11. The article as defined in claim 1 wherein the plurality of depressions are selected from the group consisting of dimples, holes, pores, grooves, inverted facets and combinations thereof.

12. The article as defined in claim 1 wherein the tribological property comprises scuffing.

13. The article as defined in claim 1 further characterized by an improved contact severity index between about 2 and about 6 times greater than the contact severity index of the textured surface.

14. A method of treating a surface to improve a tribological property of the surface, comprising:
providing a substrate with a surface, the surface including a concave texture portion;
depositing a thin layer consisting essentially of a metal lubricating material on the surface; and
substantially removing the metal lubricating material from a portion of the surface residing outside the concave texture portion to form a treated surface,
wherein the treated surface is characterized by a scuffing resistance greater than the scuffing resistance of the surface prior to treatment.

15. The method of claim 14 further comprising depositing a superhard nanocomposite coating on the surface, thereby further increasing the scuffing resistance of the treated surface.

16. The method of claim 15 wherein the metal lubricating material is selected from the group consisting of copper, a noble metal and combinations thereof, and wherein the superhard nanocomposite is selected from the group consisting of Mo—N—Cu, a carbide, a boride, a nitride, a cermet, a refractory oxide and combinations thereof.

17. An article of manufacture having a base substrate and a textured surface, the improvement characterized in that a thin layer is disposed within a plurality of concave portions of the textured surface for improving selected properties of the article of manufacture, wherein the thin layer includes a first portion comprising a superhard nanocomposite and a second portion characterized by a material having a hardness less than the substrate material.

18. The article of manufacture as defined in claim 17 wherein the thin layer comprises materials selected to provide an improved property selected from the group consisting of thermal properties, electrical properties, low friction, high scuff resistance and mechanical wear.

19. The article of manufacture as defined in claim 17 wherein the thin layer improves the contact severity index of the article by a factor of between about 2 and about 6 in relation to the contact severity index of the textured surface.

20. The article of manufacture as defined in claim 17 wherein the thin layer comprises the same material in each of the plurality of concave portions.

* * * * *